United States Patent
Kim et al.

(10) Patent No.: US 9,437,135 B2
(45) Date of Patent: Sep. 6, 2016

(54) PIXEL AND ORGANIC LIGHT EMITTING DISPLAY USING THE SAME

(71) Applicant: Samsung Display Co., Ltd., Yongin (KR)

(72) Inventors: Soon-Dong Kim, Yongin (KR); Hyung-Ryul Kang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/316,185

(22) Filed: Jun. 26, 2014

(65) Prior Publication Data

US 2015/0008405 A1    Jan. 8, 2015

(30) Foreign Application Priority Data

Jul. 3, 2013 (KR) .................. 10-2013-0077605

(51) Int. Cl.
*G09G 3/32* (2016.01)
*H01L 27/32* (2006.01)
*H01L 27/12* (2006.01)

(52) U.S. Cl.
CPC .......... *G09G 3/3233* (2013.01); *G09G 3/3291* (2013.01); *H01L 27/124* (2013.01); *H01L 27/3244* (2013.01); *H01L 27/3248* (2013.01); *H01L 27/3276* (2013.01); *G09G 2300/0842* (2013.01); *G09G 2300/0852* (2013.01); *G09G 2300/0861* (2013.01); *G09G 2320/045* (2013.01)

(58) Field of Classification Search
CPC ........... H01L 27/3262; H01L 27/3276; H01L 27/124; H01L 27/3248; H01L 27/3244; G09G 3/3233; G09G 3/3291; G09G 2300/0842; G09G 2320/045; G09G 2300/0861; G09G 2300/0852

USPC ........................................... 257/40
See application file for complete search history.

(56) References Cited

U.S. PATENT DOCUMENTS

| | | | | |
|---|---|---|---|---|
| 7,855,507 | B2 * | 12/2010 | Kim | H01L 27/3209 257/40 |
| 8,063,852 | B2 * | 11/2011 | Kwak | G09G 3/2003 315/169.3 |
| 8,400,377 | B2 * | 3/2013 | Hwang | G09G 3/3233 315/169.3 |
| 8,558,763 | B2 * | 10/2013 | Kim | G09G 3/3233 345/690 |
| 9,224,331 | B2 * | 12/2015 | Kretz | G09G 3/3233 |
| 2001/0055828 | A1 * | 12/2001 | Kaneko | G09G 3/3233 438/34 |
| 2004/0201372 | A1 * | 10/2004 | Tsai | G09G 3/006 324/73.1 |
| 2009/0096725 | A1 * | 4/2009 | Kretz | G09G 3/3233 345/82 |
| 2010/0311494 | A1 * | 12/2010 | Miller et al. | 463/22 |
| 2012/0120041 | A1 | 5/2012 | Kohno et al. | |
| 2012/0280962 | A1 | 11/2012 | Kawabe | |
| 2014/0192103 | A1 | 7/2014 | Ha | |

FOREIGN PATENT DOCUMENTS

| | | |
|---|---|---|
| JP | 2011-81267 | 4/2011 |
| JP | 2011-164136 | 8/2011 |
| KR | 10-2014-0090441 | 7/2014 |

* cited by examiner

*Primary Examiner* — John P Dulka

(74) *Attorney, Agent, or Firm* — H.C. Park & Associates, PLC

(57) ABSTRACT

A pixel and an organic light emitting display, the pixel including an organic light emitting diode, a first driver, and a second driver. The first driver controls whether current is supplied to the organic light emitting diode, according to a first data signal from a first data line. The second driver controls whether current is supplied to the organic light emitting diode, according to a second data signal from a second data line.

18 Claims, 6 Drawing Sheets

PIXEL AND ORGANIC LIGHT EMITTING DISPLAY USING THE SAME

CROSS REFERENCE TO RELATED APPLICATION

This application claims priority to and the benefit of Korean Patent Application No. 10-2013-0077605, filed on Jul. 3, 2013, which is hereby incorporated by reference for all purposes as if fully set forth herein.

BACKGROUND

1. Field

Exemplary embodiments of the present invention relate to a pixel and an organic light emitting display using the same.

2. Discussion of the Background

With the development of information technologies, the importance of a display that is able to handle high data loads while maintaining a high quality image and low power consumption is increased. Accordingly, flat panel displays (FPDs) such as a liquid crystal display (LCD), an organic light emitting display (OLED), and a plasma display panel (PDP), are increasingly used.

Among these FPDs, the OLED displays images using organic light emitting diodes that emit light through recombination of electrons and holes. The organic light emitting display has a fast response speed and a low power consumption.

However, in the current FPDs, the OLEDs are coupled directly to the voltage to maintain the proper luminance of the OLED. As a result, the degradation of the OLEDs progress rapidly, and display quality is lowered. Thus, in the field, it would be advantageous to have a means of delaying the degradation of the OLEDs, while maintaining the luminance of the OLED, thereby improving display quality.

BRIEF SUMMARY OF THE INVENTION

Exemplary embodiments provide a pixel and an organic light emitting display including the same, which can improve display quality.

Additional features of the invention will be set forth in the description which follows, and in part will be apparent from the description, or may be learned by practice of the invention.

According to an aspect of the present invention, there is provided a pixel including: an organic light emitting diode; a first driver configured to selectively supply a current to the organic light emitting diode, according to a first control signal received from a first data line; and a second driver configured to selectively supply current to the organic light emitting diode, according to a second data signal from a second data line.

According to an exemplary embodiment of the present invention, there is provided an organic light emitting display, including: pixels disposed in an area at least partially defined by scan lines, first data lines and second data lines; and a bias power supply unit configured to supply a bias voltage to the pixels, wherein each pixel includes: an organic light emitting diode; a first driver configured to selectively supply a current to the organic light emitting diode, according to a first control signal received from a first data line; and a second driver configured to selectively supply a current to the organic light emitting diode, according to a second data signal received from as second data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION

Figure 1:
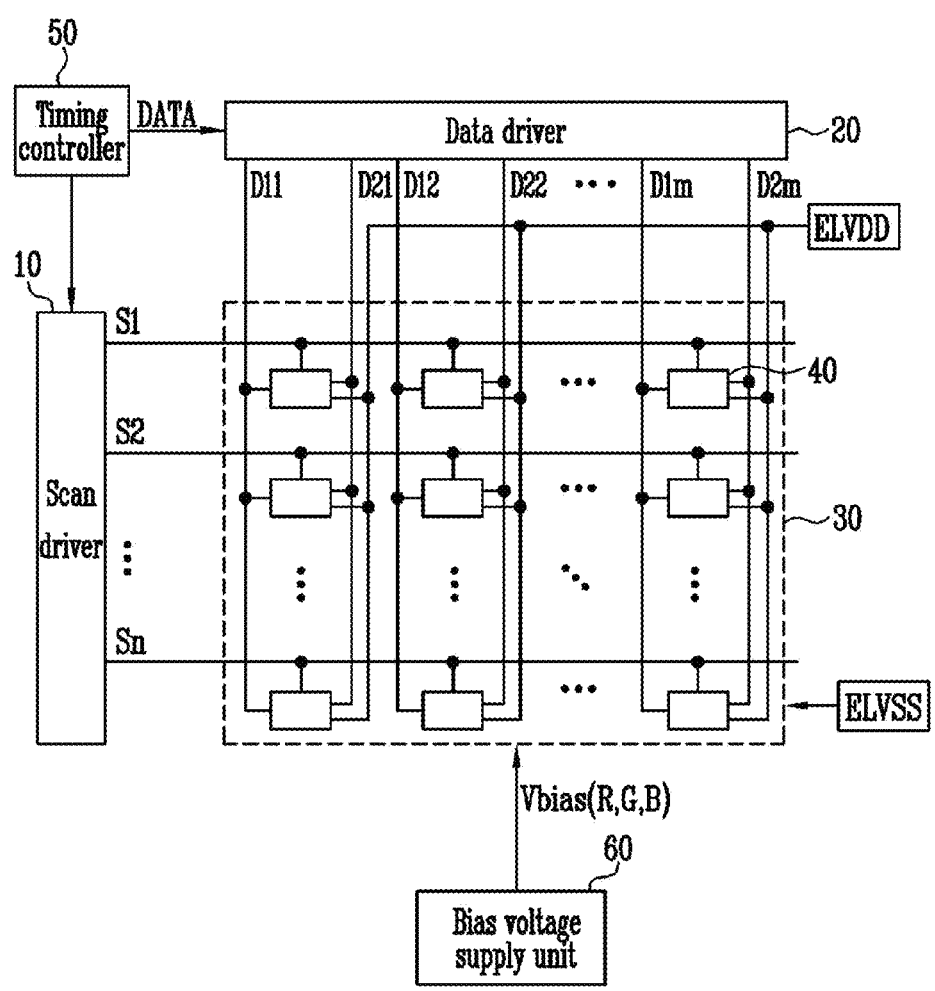
FIG. 1 is a diagram illustrating an organic light emitting display according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. In addition, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

FIG. 1 is a diagram illustrating an organic light emitting display according to an embodiment of the present invention. Referring to FIG. 1, the organic light emitting display includes a pixel unit 30 configured to include pixels 40 positioned in an area defined by scan lines S1 to Sn, first data lines D11 to D1*m*, and second data lines D21 to D2*m*; a scan driver 10 configured to drive the scan lines S1 to Sn; a data driver 20 configured to drive the first data lines D1₁ to D1m and the second data lines D2₁ to D2m; a bias voltage supply unit 60 configured to supply a bias voltage Vbias(R, G, B) to the pixels 40; and a timing controller 50 configured to control the scan driver 10 and the data driver 20.

The pixels 40 may receive first and second power sources ELVDD and ELVSS supplied from the outside of the organic light emitting display. The pixels 40 receiving the first and second power sources ELVDD and ELVSS are controlled to be in an emission or non-emission state, according to a first data signal supplied from the first data lines D1₁ to D1m and a second data signal supplied from the second data lines D2₁ to D2m.

The amount of current supplied to an organic light emitting diode (not shown) included in each pixel 40, during a period in which the pixels 40 are in the emission state, is determined by the bias voltage Vbias(R, G, B). The amount of current flowing through the organic light emitting diode included in each pixel 40 is additionally controlled according to the first and second data signals. This will be described in detail later.

The bias voltage supply unit 60 supplies the bias voltage Vbias(R, G, B) to each pixel 40. The bias voltage Vbias(R, G, B) may be determined so that a predetermined amount of current flows in the pixels 40.

The pixels 40 generate red, green, and blue light, and may have different luminances, even when supplied with the same bias voltage Vbias. The bias voltage supply unit 60 supplies a red bias voltage Vbias(R) to pixels 40 generating red light, and supplies a green bias voltage Vbias(G) to pixels 40 generating green light. In addition, the bias voltage supply unit 60 supplies a blue bias voltage Vbias(B) to pixels 40 generating blue light.

The scan driver 10 supplies a scan signal to the scan lines S1 to Sn for each scan period in sub-frames included in one frame. If the scan signal is supplied to the scan lines S1 to Sn, pixels 40 are selected for each horizontal line.

The data driver 20 generates a first data signal, corresponding to low-gray-scale bits including the least significant bits (LSB) of data DATA supplied from the timing controller 50, and supplies the generated first data signal to the first data lines D1₁ to D1m. The data driver 20 generates a second data signal, corresponding to high-gray-scale bits including the most significant bits (MSB) of the data DATA, and supplies the generated second data signal to the second data lines D2₁ to D2m. For example, the data driver 20 may receive data DATA of 12 bits, generate a second data signal, corresponding to upper 4 bits including the MSB, and generate a first data signal, corresponding to lower 8 bits including the LSB.

The data driver 20 supplies the first and second data signals, so as to be synchronized with the scan signal for each scan period in the sub-frame. The first data signal may be set to a voltage at which a transistor receiving the first data signal is turned on or turned off. Similarly, the second data signal may be set to a voltage at which a transistor receiving the second data signal is turned on or turned off. In a case where the first data signal and/or the second signal are/is set to a turn-on voltage, the pixel 40 is set in the emission state, during an emission period following the scan period.

The timing controller 50 controls the scan driver 10 and the data driver 20, corresponding to synchronization signals (not shown) supplied from the outside of the organic light emitting display. The timing controller 50 rearranges data DATA supplied from the outside and supplies the rearranged data to the data driver 20.

Figure 2:
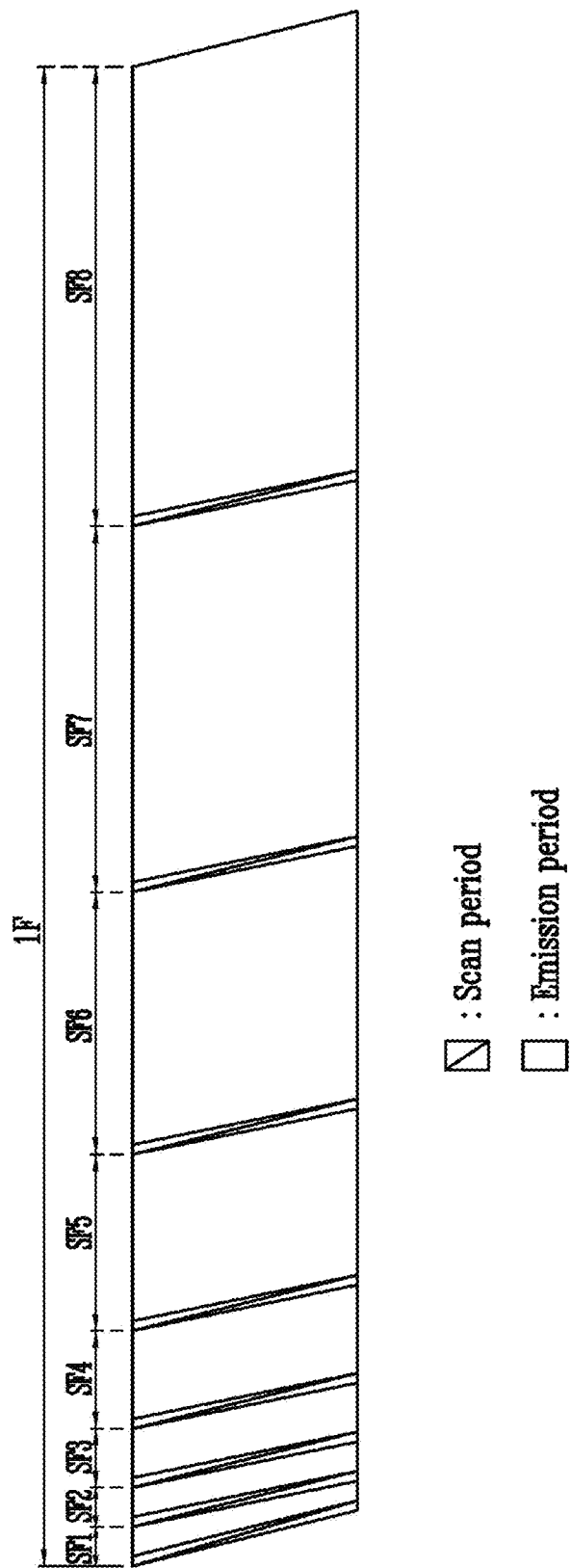
FIG. 2 is a diagram illustrating one frame according an exemplary embodiment of the present invention.

FIG. 2 is a diagram illustrating one frame 1F according an exemplary embodiment of the present invention.

Referring to FIG. 2, the frame 1F is divided into sub-frames SF1 to SF8. Each of the sub-frames SF1 to SF8 is divided into a scan period and an emission period. In the scan period, a scan signal is supplied to the scan lines S1 to Sn. In the scan period, a first data signal is supplied to the first data lines D1₁ to D1m and a second data signal is supplied to the second data lines D2₁ to D2m, in synchronization with the scan signal. Then, a voltage corresponding to the first and second data signals is charged in each pixel 40 during the scan period.

In the emission period, pixels 40 receiving the first data signal of the turn-on state (or the second data signal of the turn-on state) emit light. The pixels 40 receiving the first or second data signal of the turn-on state generate light with a first luminance. The pixels 40 receiving the first and second data signals of the turn-on state generate light with a second luminance that is higher than the first luminance.

The emission periods are set to be identical and/or different for the sub-frames SF1 to SF8, so that a predetermined gray scale may be implemented. That is, the pixels 40 emit a predetermined gray scale, corresponding to the emission period in the frame 1F.

The luminance of the pixel 40 may additionally be controlled by simultaneously supplying to the pixels 40 the first data signal corresponding to a low gray scale and the second data signal corresponding to a high gray scale, during the scan period as well as the emission period. In this case, it is possible to implement a gray scale with a desired luminance, while minimizing the number of sub-frames included in the one frame.

For example, in the related art, one frame was conventionally divided into 12 sub-frames, in order to implement a gray scale of data DATA of 12 bits. However, according to various embodiments of the present invention, the first and second data signals are simultaneously supplied during one sub-frame, corresponding to low and high gray scales. Thus, it is possible to implement a gray scale corresponding to 12 bits in 8 or fewer sub-frames.

In a case where the number of sub-frames included in the one frame is reduced as described above, the time of one horizontal period (1H) increases. If the time of 1H increases, a desired voltage can be charged in the pixel 40, corresponding to the first and second data signals, thereby ensuring the reliability of driving.

Figure 3:
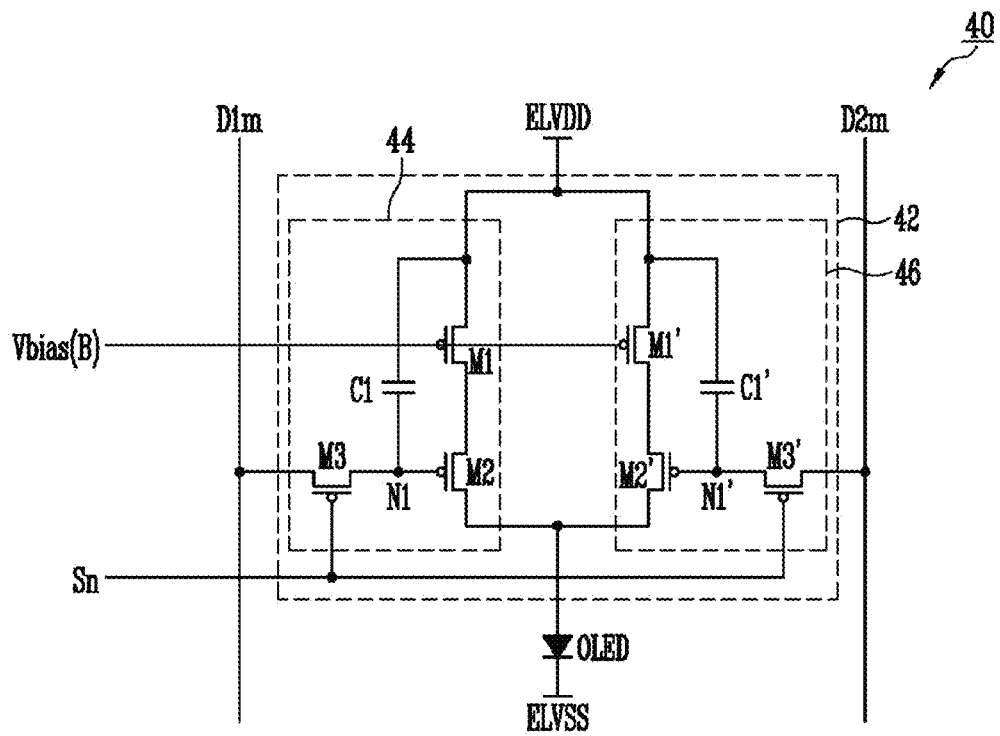
FIG. 3 is a circuit diagram illustrating a pixel according to an exemplary embodiment of the present invention.

FIG. 3 is a circuit diagram illustrating a pixel according to an exemplary embodiment of the present invention. For convenience of illustration, only a pixel 40 coupled to a first data line D1m and an n-th scan line Sn will be shown in FIG. 3.

Referring to FIG. 3, the pixel 40 includes an organic light emitting diode OLED and a pixel circuit 42 configured to control whether current is supplied to the organic light emitting diode OLED.

The organic light emitting diode OLED is set in the emission state when current is supplied from the pixel circuit 42, and is set in the non-emission state when the current is not supplied from the pixel circuit 42. The luminance of light generated in the organic light emitting diode OLED is controlled according to the amount of the current supplied from the pixel circuit 42.

The pixel circuit 42 includes a first driver 44 configured to supply or cut off a current corresponding to the first data signal, and a second driver 46 configured to supply or cutoff a current corresponding to the second data signal. The first and second drivers 44 and 46 may be implemented with the same circuit.

The first driver 44 includes a first transistor M1, a second transistor M2, a third transistor M3, and a first capacitor C1.

A first electrode of the first transistor M1 is coupled to the first power source ELVDD, and a second electrode of the first transistor M1 is coupled to a first electrode of the second transistor M2. A gate electrode of the first transistor M1 receives a bias voltage Vbias(B). The first transistor M1 is driven in a saturation region corresponding to the bias voltage Vbias(B). That is, the first transistor M1 is driven as a current source corresponding to the bias voltage Vbias(B).

The first electrode of the second transistor M2 is coupled to the second electrode of the first transistor M1, and a second electrode of the second transistor M2 is coupled to an anode electrode of the organic light emitting diode OLED. A gate electrode of the second transistor M2 is coupled to a first node N1. The second transistor M2 is turned on or turned off corresponding to a voltage at the first node N1. In other words, the second transistor M2 is set in the turn-on or turn-off state, according to the first data signal. The second transistor M2 operates as a switch according to the first data signal. Accordingly, the second transistor M2 is driven in a linear region.

In a case where the second transistor M2 is set in the turn-on state, the organic light emitting diode OLED is coupled to the first transistor M1 that is driven as the current source. That is, when the second transistor M2 is set in the turn-on state, the organic light emitting diode OLED is not directly coupled to the voltage source ELVDD, but is coupled to the first transistor M1 driven as the current source. In this case, the degradation of the organic light emitting diode OLED is minimized, thereby improving the lifespan of the pixel.

In other words, in the related art digital driving, the organic light emitting diode OLED is directly coupled to the voltage source, and hence, the degradation of the organic light emitting diode OLED is rapidly progressed. However, according to aspects of the present invention, the organic light emitting diode OLED is driven according to the current supplied from the current source M1. Thus, the degradation of the organic light emitting diode OLED can be delayed, as compared with the related art digital driving. Further, although the organic light emitting diode OLED may be degraded, the amount of the current supplied from the first transistor M1 is constantly maintained, and accordingly, it is possible to implement an image with a desired luminance.

A first electrode of the third transistor M3 is coupled to the first data line D1$m$, and a second electrode of the third transistor M3 is coupled to the first node N1. A gate electrode of the third transistor M3 is coupled to the scan line Sn. The third transistor M3 is turned on when a scan signal is supplied to the scan line Sn, to supply the first data signal from the first data line D1$m$ to the first node N1.

The first capacitor C1 is coupled between the first power source ELVDD and the first node N1. The first capacitor C1 stores a voltage corresponding to the first data signal.

The second driver 46 includes a first transistor M1', a second transistor M2', a third transistor M3', and a first capacitor C1'. The second driver 46 performs the same operation as the first driver 44, except that the second data signal is supplied from a second data line D2.$m$.

The second driver 46 will be briefly described. A first electrode of the first transistor M1' is coupled to the first power source ELVDD, and a second electrode of the first transistor M1' is coupled to a first electrode of the second transistor M2'. A gate electrode of the first transistor M1' receives a bias voltage Vbias(B). The first transistor M1' is driven in the saturation region.

The first electrode of the second transistor M2' is coupled to the second electrode of the first transistor M1', and a second electrode of the second transistor M2' is coupled to the anode electrode of the organic light emitting diode OLED. A gate electrode of the second transistor M2' is coupled to a first node N1'. The second transistor M2' is set in the turn-on or turn-off state (i.e., driven in the linear region), corresponding to the second data signal supplied to the first node N1'.

A first electrode of the third transistor M3' is coupled to the second data line D2$m$, and a second electrode of the third transistor M3' is coupled to the first node N1'. A gate electrode of the third transistor M3' is coupled to the scan line Sn. The third transistor M3' is turned on when the scan signal is supplied to the scan line Sn, to supply the second data signal from the second data line D2$m$ to the first node N1'.

The first capacitor C1' is coupled between the first power source ELVDD and the first node N1'. The first capacitor C1' stores a voltage corresponding to the second data signal.

Figure 4:
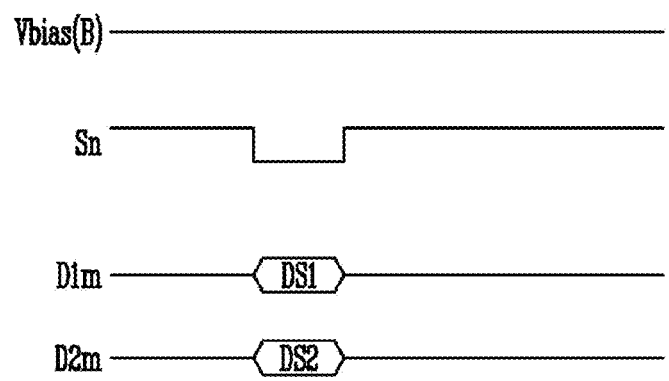
FIG. 4 is a waveform diagram illustrating an exemplary embodiment of a driving method of the pixel shown in FIG. 3.

FIG. 4 is a waveform diagram illustrating an embodiment of a driving method of the pixel shown in FIG. 3.

Referring to FIG. 4, the value of the bias voltage Vbias(B) is set so that the first transistors M1 and M1' are driven in the saturation region. Thus, the first transistors M1 and M1' receiving the bias voltage Vbias(B) are driven as current sources.

Subsequently, the scan signal is progressively supplied to the scan lines S1 to Sn during the scan period, in each of the sub-frames SF1 to SF8 (see FIG. 2), to produce a corresponding gray scale. The first data signal DS1 is supplied to the first data lines D11 to D1$m$, and the second data signal DS2 is supplied to the second data lines D21 to D2$m$, in synchronization with the scan signal.

If the scan signal is supplied to the n-th scan line Sn, the third transistors M3 and M3' are turned on. If the third transistors M3 and M3' are turned on, the first data line D1$m$ is coupled to the first node N1, and the second data line D2$m$ is coupled to the first node N1'. Then, the first data signal DS1 from the first data line D1$m$ is supplied to the first node N1, and the second data signal DS2 from the second data line D2$m$ is supplied to the first node N1'. In this case, first capacitors C1 and C1' charge voltages applied to the first nodes N1 and N1', respectively.

Subsequently, the second transistor M2 coupled to the first driver 44 is turned on or turned off according to the first data signal. If the second transistor M2 is turned on, a current from the first transistor M1 is supplied to the organic light emitting diode OLED.

Similarly, the second transistor M2' coupled to the second driver 46 is turned on or turned off according to the second data signal. If the second transistor M2' is turned on, a current from the first transistor M1' is supplied to the organic light emitting diode OLED.

When the first data signal is set in the turn-off state and the second data signal is set in the turn-on state, the organic light emitting diode OLED emits light, corresponding to the amount of current supplied via the second transistor M2'. In a case where the second data signal is set in the turn-off state and the first data signal is set in the turn-on state, the organic light emitting diode OLED emits light corresponding to the amount of current supplied via the second transistor M2.

When the first and second data signals are set in the turn-on state, the organic light emitting diode OLED emits light, corresponding to the amount of current supplied via the second transistors M2 and M2'. In this case, the organic light emitting diode OLED emits light with a luminance slightly higher than that when the first data signal of the turn-on state (or the second data signal of the turn-on state) is supplied. That is, a gray scale can be implemented using an emission time, and simultaneously, the luminance of light generated in the organic light emitting diode OLED can be additionally controlled using the first and second data signals.

Figure 5:
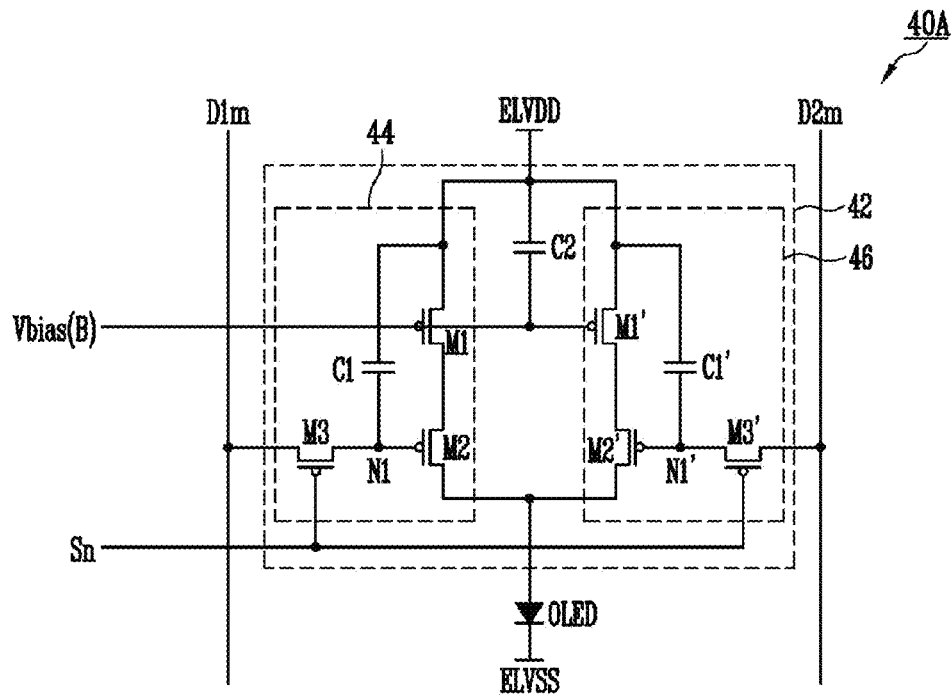
FIG. 5 is a circuit diagram illustrating a pixel according to an exemplary embodiment of the present invention.

FIG. 5 is a circuit diagram illustrating a pixel 40A, according to an exemplary embodiment of the present invention. In FIG. 5, components similar to those of FIG. 3 are designated by like reference numerals, and their detailed descriptions are omitted.

Referring to FIG. 5, the pixel 40A further includes a second capacitor C2 coupled between the gate electrodes of the first transistors M1 and M1' and the first power source ELVDD.

The second capacitor C2 stably maintains the bias voltage Vbias(B). In other words, the first and second data signals are set to a turn-on voltage and/or a turn-off voltage for each horizontal period. In this case, the voltages of the first and second data lines D1m and D2m are changed for each horizontal period, and the voltages at the gate electrodes of the first transistors M1 and M1' may be fluctuated. The second capacitor C2 prevents the voltages at the gate electrode of the first transistors M1 and M1' from being changed, and accordingly, the reliability of operation may be improved.

Figure 6:
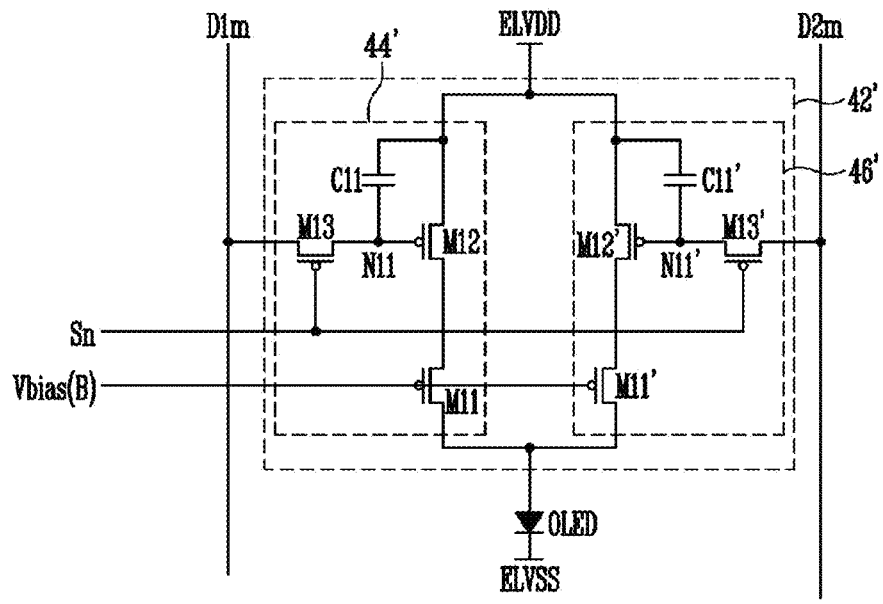
FIG. 6 is a circuit diagram illustrating a pixel according to an exemplary embodiment of the present invention.

FIG. 6 is a circuit diagram illustrating a pixel 40B according to an exemplary embodiment of the present invention.

Referring to FIG. 6, the pixel 40B includes an organic light emitting diode OLED and a pixel circuit 42'.

The organic light emitting diode OLED is set in the emission state when the current from the pixel circuit 42' is supplied, and is set in the non-emission state when the current from the pixel circuit 42' is not supplied. The luminance of light generated in the organic light emitting diode OLED is controlled corresponding to the amount of the current supplied from the pixel circuit 42'.

The pixel circuit 42' includes a first driver 44' configured to supply or cut off current, corresponding to the first data signal, and a second driver 46' configured to supply or cut off current, corresponding to the second data signal.

The first driver 44' includes a first transistor M11, a second transistor M12, a third transistor M13, and a first capacitor C11.

A first electrode of the first transistor M11 is coupled to a second electrode of the second transistor M12, and a second electrode of the first transistor M11 is coupled to an anode electrode of the organic light emitting diode OLED. A gate electrode of the first transistor M11 receives a bias voltage Vbias(B). The first transistor M11 is driven as a current source in the saturation region, corresponding to the bias voltage Vbias(B).

A first electrode of the second transistor M12 is coupled to the first power source ELVDD, and the second electrode of the second transistor M12 is coupled to the first electrode of the first transistor M11. A gate electrode of the second transistor M12 is coupled to a first node N11. The second transistor M12 is turned on or turned off corresponding to the first data signal.

A first electrode of the third transistor M13 is coupled to the first data line D1m, and a second electrode of the third transistor M13 is coupled to the first node N11. A gate electrode of the third transistor M13 is coupled to the scan line Sn. The third transistor M13 is turned on when the scan signal is supplied to the scan line Sn, to supply the first data signal from the first data line D1.m to the first node N11.

The first capacitor C11 is coupled between the first power source ELVDD and the first node N11. The first capacitor C11 stores a voltage corresponding to the first data signal.

The second driver 46' includes a first transistor M11', a second transistor M12', a third transistor M13' and a first capacitor C11'. The second driver 46' is configured identically to the first driver 44', except that the second driver 46' receives the second data signal supplied from the second data line D2m.

The operating process of the pixel 40B substantially identical to that of the pixel 40 of FIG. 3, except that the positions of the first transistors M11 and M11' and the second transistors M12 and M12' are changed.

Figure 7:
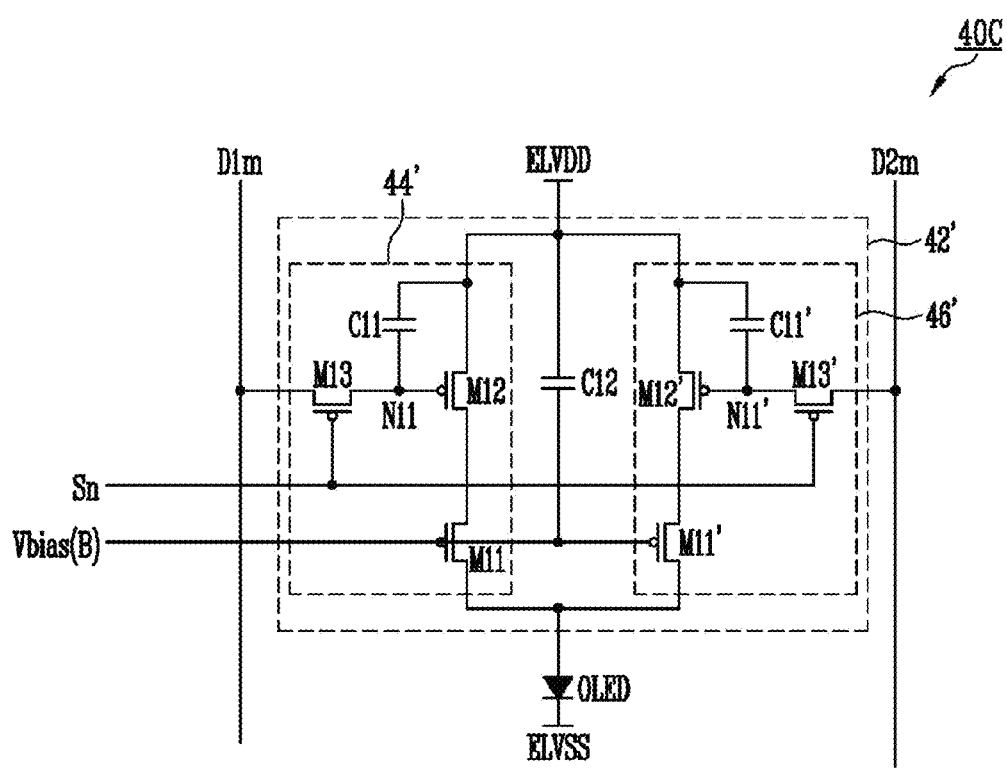
FIG. 7 is a circuit diagram illustrating a pixel according to an exemplary embodiment of the present invention.

FIG. 7 is a circuit diagram illustrating a pixel 40C according to still an exemplary embodiment of the present invention. In FIG. 7, components identical to those of FIG. 6 are designated by like reference numerals, and their detailed descriptions will be omitted.

Referring to FIG. 7, the pixel 40C further includes a second capacitor C12 coupled between the gate electrodes of the first transistors M11 and M11' and the first power source ELVDD. The second capacitor C12 stably maintains the bias voltage Vbias(B).

Figure 8:
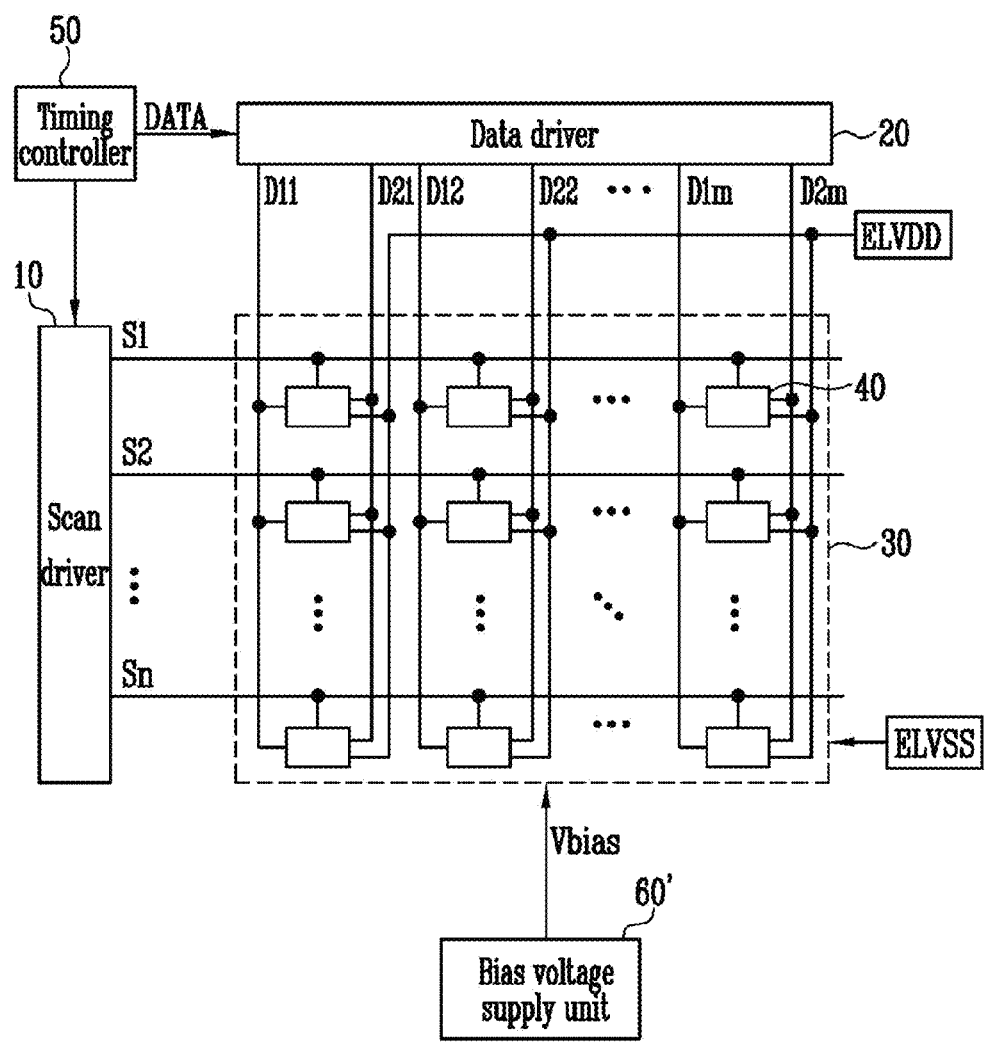
FIG. 8 is a diagram illustrating an organic light emitting display according to an exemplary embodiment of the present invention.

FIG. 8 is a diagram illustrating an organic light emitting display according to an exemplary embodiment of the present invention. In FIG. 8, components similar to those of FIG. 1 are designated by like reference numerals, and their detailed descriptions are omitted.

Referring to FIG. 8, in the organic light emitting display, a bias voltage supply unit 60' supplies the same bias voltage Vbias to all pixels 40. In other words, the bias voltage supply unit 60' supplies the same bias voltage Vbias to the pixels 40 generating red, green and blue light. In this case, the number of signal lines for supplying the bias voltage Vbias is decreased, the organic light emitting display is advantageous in high resolution.

Meanwhile, although it has been described in the present invention that the transistors are shown as PMOS transistors for convenience of illustration, the present invention is not limited thereto. In other words, the transistors may be formed as NMOS transistors.

According to various embodiments, the organic light emitting diodes OLED generate red, green and blue light, corresponding to the amount of current supplied from the driving transistor. However, the present invention is not limited thereto. For example, the organic light emitting diode OLED may generate white light, corresponding to the amount of the current supplied from the driving transistor. In this case, a color image is implemented using a separate color filter or the like.

By way of summation and review, an organic light emitting display includes a plurality of pixels arranged in a matrix form at intersection portions of a plurality of data lines, a plurality of scan lines and a plurality of power lines. Each pixel generally includes an organic light emitting diode, two or more transistors including a driving transistor, and one or more capacitors.

The organic light emitting display has low power consumption, but an image with a desired luminance is displayed due to degradation of the organic light emitting diode.

In the pixel and the organic light emitting display using the same according to the present invention, the pixel is driven using a digital driving method, and includes a first driver configured to control the supply of current to an organic light emitting diode, corresponding to a low gray scale and a second driver configured to control the supply of current to the organic light emitting diode, corresponding to a high gray scale. In the present invention, an image corresponding to the low and high gray scales is displayed using the first and second drivers, and accordingly, it is possible to minimize the number of sub-frames included in one frame.

In the present invention, the pixel is driven using the digital driving method, and simultaneously, the amount of current can be controlled corresponding to the low and high gray scales, thereby implementing a larger number of gray scales.

Additionally, in the present invention, a gray scale is implemented using a transistor driven as a current source by a bias voltage and a transistor driven as a switch by a data signal. Here, the transistor driven as the current source supplies constant current, regardless of degradation of the organic light emitting diode, and accordingly, it is possible to prevent the lowering of luminance, caused by the degradation of the organic light emitting diode. Further, the organic light emitting diode is not directly coupled to the first power source but receives current from the transistor driven as the current source, thereby minimizing the degradation of the organic light emitting diode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pixel, comprising:
   an organic light emitting diode;
   a first driver configured to selectively supply a first current to the organic light emitting diode based on a first data signal received from a first data line; and
   a second driver configured to selectively supply a second current to the organic light emitting diode based on a second data signal received from a second data line,
   wherein each of the first and second drivers comprises:
      a first transistor coupled between a first power source and the organic light emitting diode, the first transistor configured to supply a driving current to the organic light emitting diode while being driven in a saturation region corresponding to a bias voltage,
      a second transistor disposed on a current path along which the driving current flows, the second transistor configured to turn on or off based on at least one of the first data signal and the second data signal, and
      a first capacitor coupled between a gate electrode of the second transistor and the first power source.

2. The pixel of claim 1, wherein the first and second drivers are in a same circuit.

3. The pixel of claim 1, wherein the second transistor is driven in a linear region.

4. The pixel of claim 1, wherein each of the first and second drivers further comprises a third transistor coupled between the gate electrode of the second transistor and at least one of the first data line and the second data line, the third transistor configured to be turned on when a scan signal is supplied to a scan line.

5. The pixel of claim 1, further comprising a second capacitor coupled between a gate electrode of the first transistor and the first power source.

6. The pixel of claim 1, wherein the second transistor is disposed between the first transistor and the organic light emitting diode.

7. The pixel of claim 1, wherein the second transistor is disposed between the first power source and the first transistor.

8. An organic light emitting display, comprising:
   pixels disposed in an area at least partially defined by scan lines, first data lines, and second data lines; and
   a bias power supply unit configured to supply a bias voltage to the pixels,
   wherein each pixel comprises:
      an organic light emitting diode;
      a first driver configured to selectively supply a first current supplied to the organic light emitting diode based on a first data signal received from a first data line; and
      a second driver configured to selectively supply a second current to the organic light emitting diode based on a second data signal received from a second data line,
      wherein each of the first and second drivers comprises:
         a first transistor coupled between a first power source and the organic light emitting diode, the first transistor configured to supply a driving current to the organic light emitting diode while being driven in a saturation region corresponding to the bias voltage;
         a second transistor positioned on a current path along which the driving current flows, the second transistor configured to turn on or off based on at least one of the first data signal and the second data signal; and
         a first capacitor coupled between a gate electrode of the second transistor and the first power source.

9. The organic light emitting display of claim 8, wherein the bias power supply unit is configured to supply different voltages to red, green, and blue pixels that generate red light, green light, and blue light, respectively.

10. The organic light emitting display of claim 8, further comprising:
    a timing controller configured to supply data to a data driver;
    a scan driver configured to supply a scan signal to the scan lines for each scan period of sub-frames comprised in one frame,
    wherein the data driver is configured to supply the first data signal to the first data lines and to supply the second data signal to the second data lines, in synchronization with the scan signal.

11. The organic light emitting display of claim 10, wherein the data driver is configured to:
    generate the first data signal according to low-gray-scale bits comprising least significant bits (LSB) of the data, and
    generate the second data signal according to high-gray-scale bits comprising most significant bits (MSB) of the data.

12. The organic light emitting display of claim 8, wherein the first data signal is:

a turn-on voltage at which the first current flows from the first driver to the organic light emitting diode, or a turn-off voltage at which the first current does not flow from the first driver to the organic light emitting diode.

13. The organic light emitting display of claim 8, wherein the second data signal is:

a turn-on voltage at which the second current flows from the second driver to the organic light emitting diode, or a turn-off voltage at which the second current does not flow from the second driver to the organic light emitting diode.

14. The organic light emitting display of claim 8, wherein the second transistor is driven in a linear region.

15. The organic light emitting display of claim 8, wherein each of the first and second drivers further comprises a third transistor coupled between the gate electrode of the second transistor and at least one of the first data line and the second data line, the third transistor configured to be turned on when a scan signal is supplied to a scan line.

16. The organic light emitting display of claim 8, wherein the pixel further comprises a second capacitor coupled between a gate electrode of the first transistor and the first power source.

17. The organic light emitting display of claim 8, wherein the second transistor is disposed between the first transistor and the organic light emitting diode.

18. The organic light emitting display of claim 8, wherein the second transistor is disposed between the first power source and the first transistor.

* * * * *